United States Patent
Hotchkiss et al.

(10) Patent No.: US 6,723,629 B2
(45) Date of Patent: Apr. 20, 2004

(54) METHOD AND APPARATUS FOR ATTACHING SOLDER MEMBERS TO A SUBSTRATE

(75) Inventors: Gregory B. Hotchkiss, Richardson, TX (US); Gary D. Stevens, Dallas, TX (US)

(73) Assignee: Texas Instruments Incorporated, Dallas, TX (US)

(*) Notice: Subject to any disclaimer, the term of this patent is extended or adjusted under 35 U.S.C. 154(b) by 0 days.

(21) Appl. No.: 10/191,473

(22) Filed: Jul. 10, 2002

(65) Prior Publication Data

US 2003/0013228 A1 Jan. 16, 2003

Related U.S. Application Data

(62) Division of application No. 09/964,734, filed on Nov. 5, 1997, now abandoned.
(60) Provisional application No. 60/031,802, filed on Nov. 27, 1996.

(51) Int. Cl.$^7$ .......................... H01L 21/44; B23K 31/00; B23K 31/02; G03C 1/492; G03C 1/494
(52) U.S. Cl. ............. 438/612; 228/180.21; 228/180.22; 430/270.1
(58) Field of Search .................. 438/108, 612; 228/180.22, 56.3, 6.2, 41, 180.21, 244, 246, 247; 206/716; 430/270.1, 328, 396

(56) References Cited

U.S. PATENT DOCUMENTS

| | | | |
|---|---|---|---|
| 5,065,505 A | * 11/1991 | Matsubara et al. | ........... 29/830 |
| 5,381,848 A | 1/1995 | Trabucco | ..................... 164/102 |
| 5,388,327 A | 2/1995 | Trabucco | ..................... 29/830 |
| 5,453,017 A | 9/1995 | Belopolsky | .................. 439/83 |
| 5,615,477 A | 4/1997 | Sweitzer | ...................... 29/840 |
| 5,620,927 A | 4/1997 | Lee | .............................. 29/841 |
| 5,662,262 A | 9/1997 | McMahon et al. | ......... 228/56.3 |
| 5,861,323 A | 1/1999 | Hayes | ........................ 438/111 |
| 5,899,737 A | 5/1999 | Trabucco | .................... 438/615 |

* cited by examiner

Primary Examiner—Carl Whitehead, Jr.
Assistant Examiner—Nema Berezny
(74) Attorney, Agent, or Firm—Wade James Brady, III; Frederick J. Telecky, Jr.

(57) ABSTRACT

The invention discloses a method for attaching solder members (114) to a substrate (112). The method includes forming a decal (110) with a plurality of solder members (114). The method further comprises aligning the decal (110) with the substrate (112) and transferring the solder members (114) on the decal (110) to the substrate (112).

10 Claims, 6 Drawing Sheets

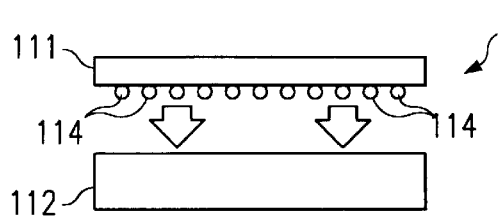
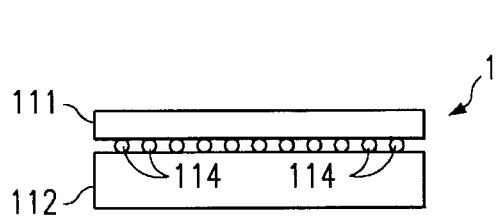
FIG. 1A   FIG. 1B
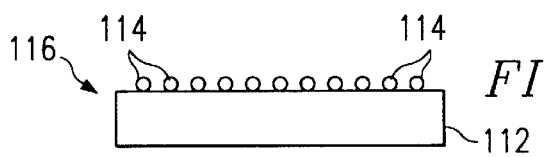
FIG. 1C
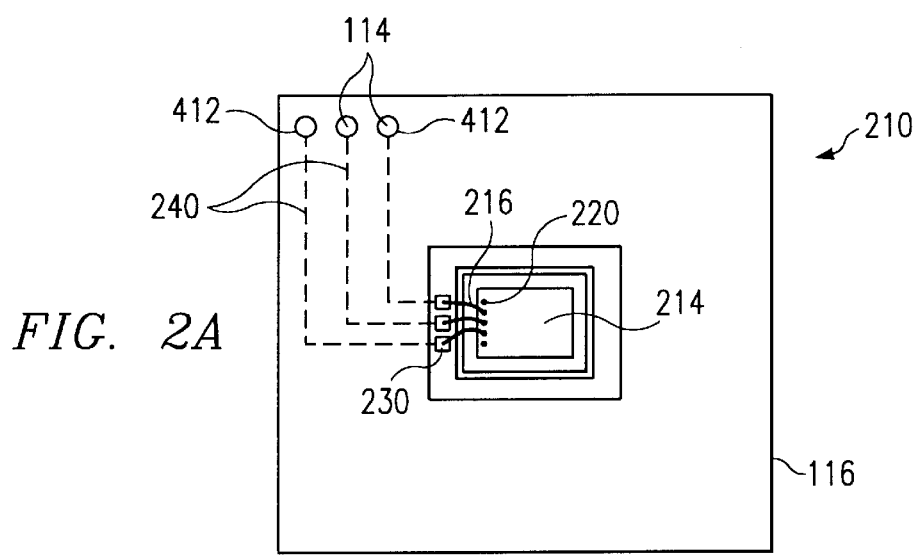
FIG. 2A
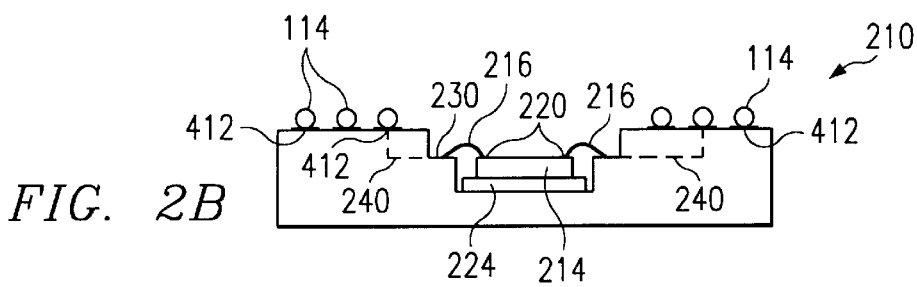
FIG. 2B
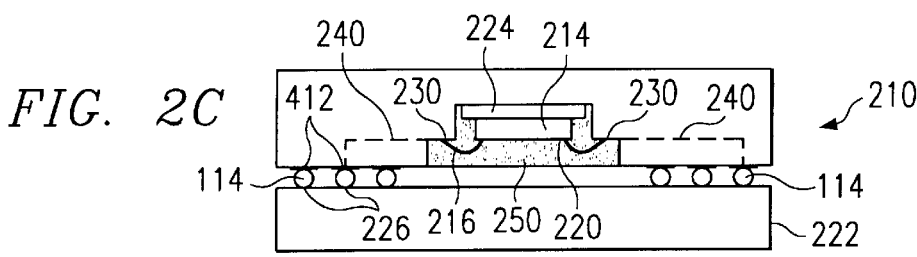
FIG. 2C

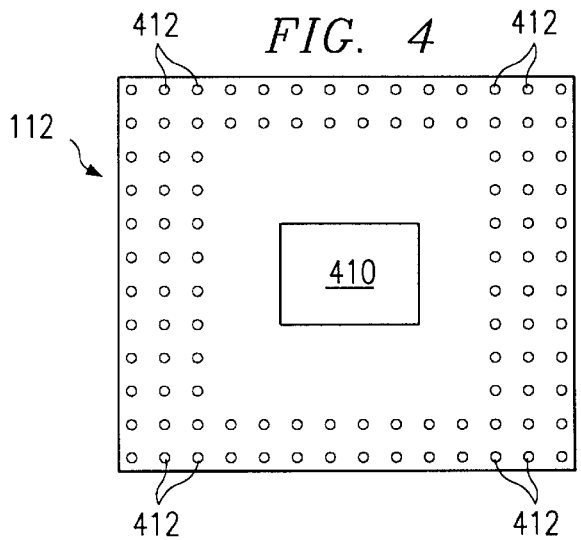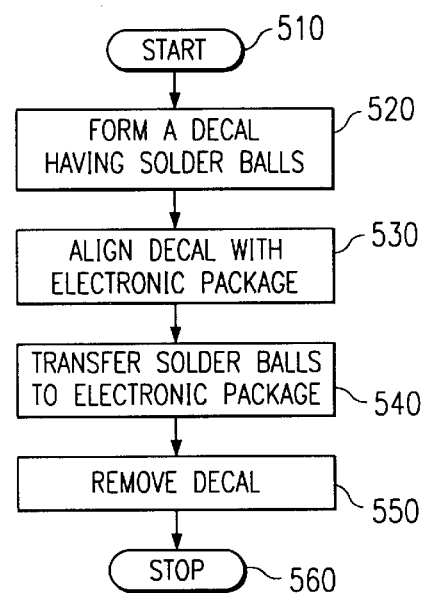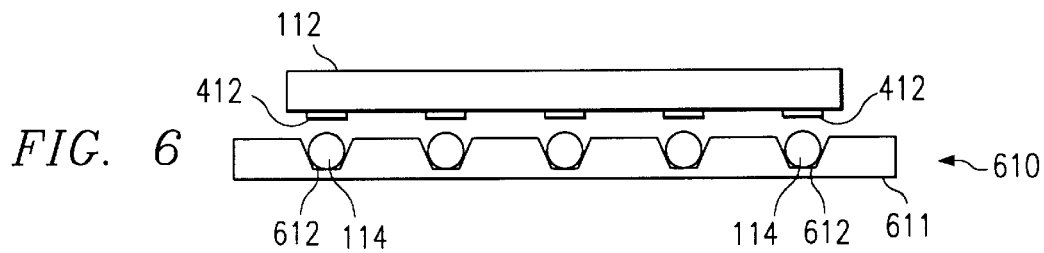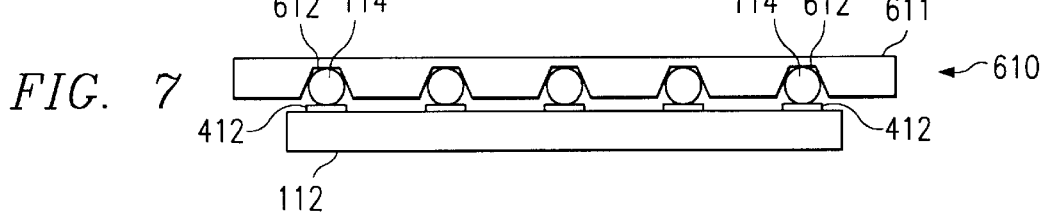

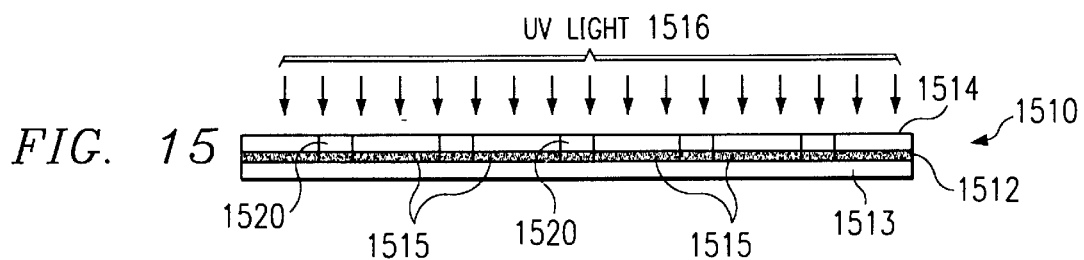
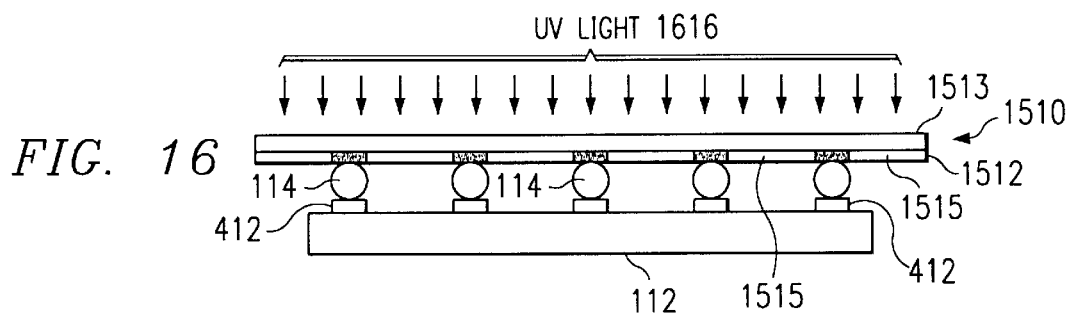
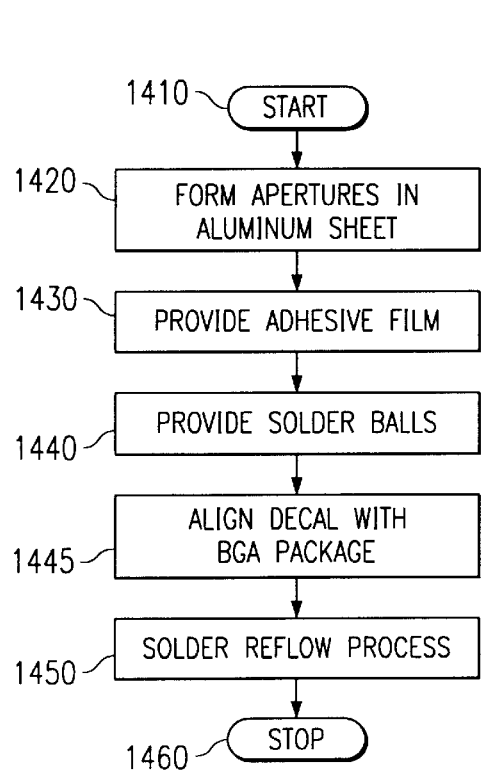
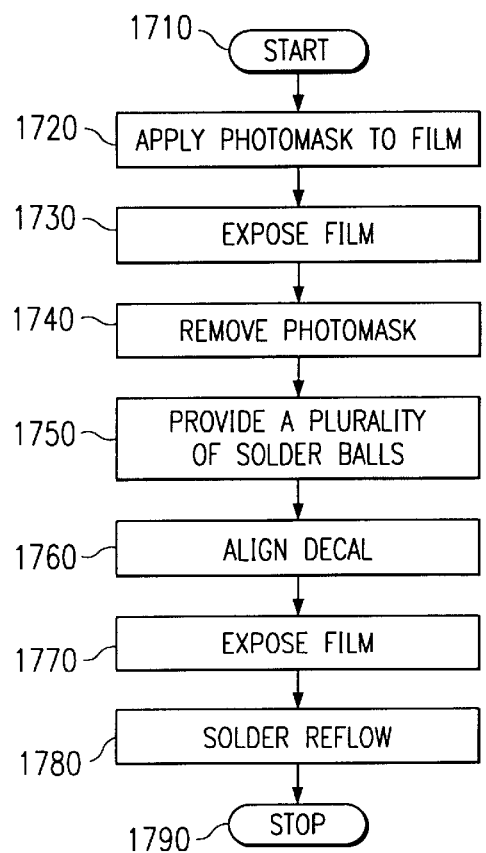

METHOD AND APPARATUS FOR ATTACHING SOLDER MEMBERS TO A SUBSTRATE

This application is a division of Ser. No. 09/964,734, filed Nov. 5, 1997, ABN, which claims priority from Provisional Application Serial No. 60/031,802, Nov. 27, 1996.

TECHNICAL FIELD OF THE INVENTION

This invention relates generally to the field of electronic devices packaging and more particularly to a method and apparatus for attaching solder members to a substrate.

BACKGROUND OF THE INVENTION

Modern electronic components utilize numerous integrated circuits. Often, these integrated circuits must be electrically connected to each other or to other electronic components. One method for connecting integrated circuits to electronic components utilizes an area array electronic package. Some examples of area array electronic package designs are a ball grid array electronic package and a flip-chip electronic package. With a ball grid array electronic package, various input and output ports of an integrated circuit are typically connected via wire bonds to contact pads on the ball grid array electronic package. Solder balls formed on the contact pads of the ball grid array electronic package are used to complete the connection to another electronic component, such as a printed circuit board. Integrated circuits are also connected to electronic components through a flip-chip electronic package design. The flip-chip electronic package is similar to the ball grid array electronic package in that solder balls are used to make a connection with other electronic components, such as a printed circuit board. However, solder balls in a flip-chip design are attached directly to the input and output ports on the face of the integrated circuit. Flip-chip packages do not require wire bonds. One important step in the above described methods for interconnecting electronic components is the formation of solder balls on the ball grid array package or flip-chip electronic package.

Several conventional methods exist for attaching solder balls to a ball grid array or flip-chip electronic packages. Flip-chip solder bumps may be fabricated on the integrated circuit by evaporation or plating while the solder necessary for a ball grid array electronic package may be achieved by solder paste printing or vacuum loading preformed solder balls onto a substrate through the use of a vacuum chuck. The use of a vacuum chuck to transfer preformed solder balls to the contact pads on the ball grid array package suffers several disadvantages. For example, the minimum distance between solder balls that this method allows may be unacceptable in some applications. Additionally, this conventional method may require two vacuum chucks because while one vacuum chuck is transferring solder balls to the ball grid array electronic package, the other is being filled. The use of one or more vacuum chucks increases the expense associated with this method for forming solder balls on an electronic package. Furthermore, if a solder ball is not transferred properly, any adjustment, such as adding a missing solder ball, must be made by hand.

Another conventional method for attaching solder to a ball grid array or flip-chip electronic package utilizes a stencil placed on top of the package. In a typical application, solder paste is applied on top of the stencil and then a squeegee is moved across the top of the stencil forcing the solder paste down through the holes until contact is made with the contact pads of the ball grid array or flip-chip electronic package. This method also suffers several disadvantages. For example, the stencil requires cleaning. Additionally, the stencils tend to deteriorate because the solder paste may wear on the stencils. Furthermore, the use of solder paste may be more expensive than the use of solder balls.

SUMMARY OF THE INVENTION

Therefore, a need has arisen for a new method and apparatus that overcomes the disadvantages and deficiencies of the prior art. The invention comprises a method and apparatus for attaching solder members to a substrate.

According to one aspect of the invention, the method comprises the step of forming a decal. The decal comprises a plurality of solder members. The method further comprises aligning the decal with a substrate and transferring the solder members on the decal to the substrate.

According to another aspect of the invention, a method for forming a decal for transferring solder member to a substrate comprises the step of forming a plurality of apertures in a substrate and placing a plurality of solder members on the substrate. The method further comprises allowing the plurality of solder members on the substrate to enter the plurality of apertures to form a decal having a plurality of solder members.

The invention provides a method for attaching solder members to a substrate that facilitates precise alignment of the solder members with desired locations on the substrate. Because only the decal requires alignment, in contrast to aligning multiple solder members with desired locations on a ball grid array package, precise alignment of all solder members with desired locations on the ball grid array package may be made through one alignment process. Missing balls are often a problem in conventional ball grid array production lines. The invention may enhance the production efficiency and yield of non-missing balls by screening out defective decals before shipment to a vendor. This screening process contrasts with conventional screening that may take place after attachment of solder balls to the ball grid array package.

The invention also allows for the formation at a central site of solder member decals that may be shipped to remote locations for transferring the solder members to the ball grid array package. Therefore, much of the equipment conventionally used to place solder on a ball grid array can be eliminated, which may reduce the cost of forming solder balls on ball grid arrays. Any equipment required to produce the solder member decal may reside solely at a centralized location. Formation of a solder member decal also facilitates delegation to third parties of a portion of the solder ball attachment process, which may further reduce costs. Because the solder member decals may be formed without solder paste, the use of solder member decals does not expose the ball grid array package or other substrate to which solder members may be attached to the harshness of such a chemical process. The use of preformed solder members eliminates the expense of using environmentally unfriendly chemicals. The use of solder balls rather than solder paste also provides a more uniform distribution of solder and allows the use of various types of solder alloys.

BRIEF DESCRIPTION OF THE DRAWINGS

For a more complete understanding of the present invention and the advantages thereof, reference is now made to the following descriptions taken in connection with the accompanying drawings in which:

FIGS. 1A through 1C are simplified side view illustrations of method steps according to the teachings of the present invention;

FIG. 2A is a top view of an exemplary integrated circuit package utilizing the invention;

FIGS. 2B AND 2C are side views of the integrated circuit package shown in FIG. 2A;

FIG. 4 is a top view of an exemplary ball grid array package;

FIG. 5 is a flow chart illustrating one method of attaching solder balls to an electronic package according to the invention;

FIG. 6 is a side view of one embodiment of the solder member decal shown in FIG. 1A and a side view of the ball grid array package shown in FIG. 1A;

FIG. 7 is a side view of the solder member decal and ball grid array package shown in FIG. 6 and illustrates the transfer of solder balls from the solder member decal to a ball grid array package;

FIG. 14 is a flow chart illustrating one method of attaching solder balls to a ball grid array package utilizing the solder member decal shown in FIG. 12;

FIG. 15 is a side view of another embodiment of the solder member decal shown in FIG. 1A and a photomask used in the formation of the solder member decal;

FIG. 16 is a side view of the solder member decal shown in FIG. 15 and the ball grid array package shown in FIG. 1A and further illustrates the transfer of solder balls from the solder member decal to the ball grid array package; and FIG. 17 is a flow chart illustrating one method of attaching solder balls to a ball grid array package utilizing the solder member decal shown in FIGS. 15 and 16.

DETAILED DESCRIPTION OF THE INVENTION

Figure 2D:
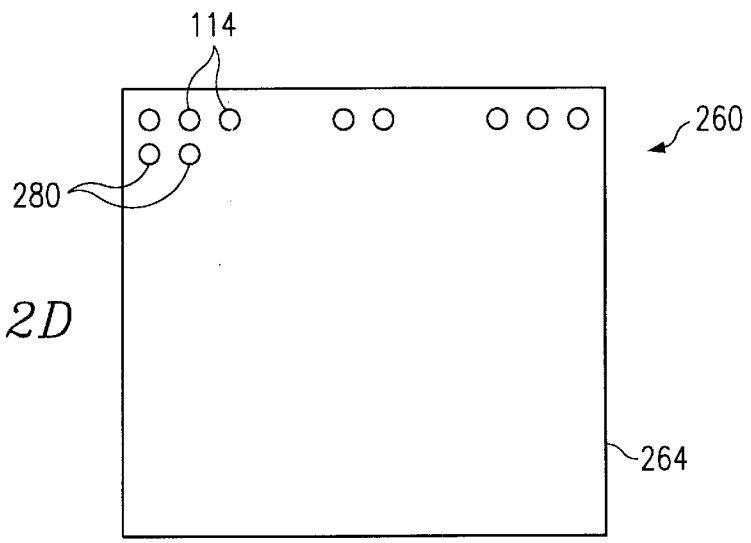
FIG. 2D is a top view of a flip-chip electronic package design in which an integrated circuit has solder balls attached to its contact pads.

The invention and its advantages are best understood by referring to FIGS. 1 through 17 of the drawings, like numerals being used for like and corresponding parts of the various drawings.

FIGS. 1A through 1C illustrate an embodiment of the invention. In FIG. 1A a ball grid array (BGA) package 112 is illustrated. In one embodiment, the invention provides a method for attaching solder members, such as solder balls 114, to a substrate, such as ball grid array package 112. Elements commonly used in solder alloys are tin, lead, silver, bismuth, copper, indium, antimony, and cadmium; however, any suitable elements for use as solder may be used to form solder members, such as solder balls 114. Ball grid array package 112 may be a conventional ball grid array package. Examples of conventional ball grid array substrate materials include organic laminates, ceramics, metals and polymeric sheets and films. Ball grid array package 112 may also comprise any suitable substrate to which solder members may be attached to facilitate electrical connection of electronic devices. Also, as discussed in greater detail below, solder members may be attached directly to other substrates, such as, for example, an interposer or an integrated circuit in a flip-chip electronic package. FIG. 1A also illustrates one embodiment of a solder member decal 110 according to the invention. Solder member decal 110 comprises a substrate 111 with a plurality of solder members, such as solder balls 114, formed thereon. Solder balls 114 may alternatively be replaced with solder members having a variety of configurations, such as solder columns, which are cylindrical in shape. According to the invention, solder balls 114 are temporarily formed or placed on substrate 111 for subsequent transfer to ball grid array package 112. As discussed in greater detail below, ball grid array package 112 may comprise a plurality of contact pads (not shown explicitly in FIGS. 1A through 1C). According to one embodiment of the invention, solder balls 114 may be transferred to the contact pads on ball grid array package 112.

FIG. 1B illustrates the step of aligning solder member decal 110 with ball grid array package 112. According to the invention, solder balls 114 may be attached to ball grid array package 112 at desired locations by alignment of solder member decal 110 with ball grid array package 112, bringing solder balls 114 into contact with a portion of ball grid array package 112, and subsequent transfer of solder balls 114 to ball grid array package 112. As discussed in greater detail below, solder member decal 110 may be placed on top of ball grid array package 112 to facilitate transfer of solder balls 114 from solder member decal 110 to ball grid array package 114. Alternatively, ball grid array package 112 may be placed on top of solder member decal 110. In addition, other suitable orientations of solder member decal 110 and ball grid array package 112 that facilitate transfer of solder balls 114 to a ball grid array package 112 may be utilized. After aligning solder member decal 110 with a grid array package 112, solder balls 114 may be transferred to ball grid array package 112. This transfer process may include a solder reflow process. Solder member decal 110 may be removed from solder balls 114 to produce an attachment-ready ball grid array package 116, shown in FIG. 1C. Solder member decal 110 may be removed from the ball grid array package 112 at various points in the above-described process. For example, solder member decal 110 may be removed from solder balls 114 and ball grid array package 112 before or after a solder reflow process.

FIG. 1C illustrates an attachment-ready ball grid array package 116. Solder balls 114 are securely attached to ball grid array package 112 to form attachment-ready ball grid array package 116. Solder balls 114 formed on attachment-ready ball grid array package 116 may provide a plurality of electrical connection points to facilitate connection of one electronic device to another. The solder balls 114 on the attachment-ready ball grid array package 116 may be attached to contact pads of various electronic components, such as a printed circuit board.

FIGS. 2A, 2B, and 2C illustrate one example of a integrated circuit package 210 utilizing an attachment-ready ball grid array package 116 according to the invention. Integrated circuit package 210 comprises an attachment-ready ball grid array package 116 with an integrated circuit 214 formed thereon. Integrated circuit 214 may be attached to attachment-ready ball grid array package 116 with an epoxy 224, as shown in FIG. 2B. Various integrated circuit connection ports 220 are electrically connected via wire bonds 216 to bond pads 230 on attachments ready ball grid array package 116. As shown in FIG. 2A, bond pads 230 are electrically connected to contact pads 412 by electrically conductive interconnect lines 240. Contact pads 412 are shown best in FIG. 4. The interconnect lines 240 may be patterned in one or more layers, with some of the interconnect lines 240 placed below the surface of the attachment-ready ball grid array package 116. Solder balls 114 are connected to contact pads 412. Wire bonds 216 may be free-standing wires. As illustrated in FIG. 2C, integrated circuit connection ports 220 are electrically connected to contact pads 226 on a printed circuit board 222 by connecting printed circuit board contact pads 226 to solder balls 114. To environmentally protect the integrated circuit 214 from the potentially corrosive nature of the atmosphere, the region surrounding the integrated circuit 114, bond wires 216, and bond pads 230, may be filled with polymeric material 250. Therefore, the formation of solder balls 114 on contact pads 412 facilitates connection of printed circuit board contact pads 226 to ball grid array contact pads 412, which allows electrical connection between integrated circuit 214 and printed circuit board 222. Thus, the invention provides a method for forming solder balls 114 on a ball grid array 112 that facilitates the connection of an integrated circuit, such as integrated circuit 214, to another electronic component, such as printed circuit board 222.

Figure 2E:
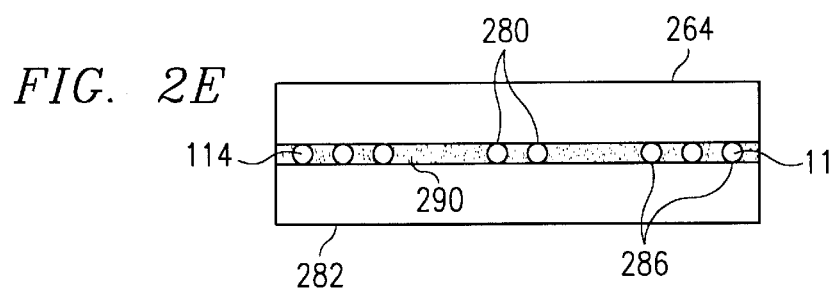
FIG. 2E is a side view of the flip-chip electronic package shown in FIG. 2D.

FIGS. 2D and 2E illustrate an example of a flip-chip electronic package 260 and its connection to a printed circuit board 282. Flip-chip 260 is another example of a substrate onto which solder members may be formed according to the invention. As illustrated in FIGS. 2D and 2E, flip-chip electronic package 260 allows connection of the integrated circuit 264 to printed circuit board 282 without the use of wire bonds such as wire bonds 216 and without use of bond pads such as bond pads 230. Solder balls 114 are formed directly on various connection ports 280, which may be formed flush with a surface of integrated circuit 264. Integrated circuit 264 is substantially similar to integrated circuit 214. Solder balls 114 electrically connect the integrated circuit connection ports 280 to contact pads 286 on printed circuit board 282, as shown in FIG. 2E. After connection, a polymeric or elastomeric underfill material 290 is applied between the integrated circuit 264 and the printed circuit board 282 to protect the integrated circuit 264 from the environment and to provide strain relief to the electronic package.

Figure 3A:
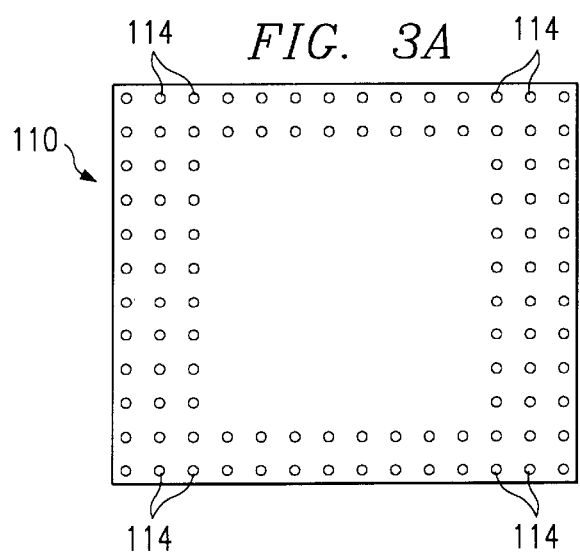
FIG. 3A is a top view of an exemplary solder member decal according to the invention.
Figure 3B:
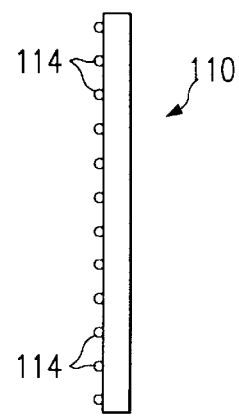
FIG. 3B is a side view of the solder member decal shown in FIG. 3A.

FIGS. 3A and 3B further illustrate details of an exemplary of solder member decal 110. The solder member decal 110 shown in FIGS. 3A and 3B comprises a plurality of solder balls 114 formed around the perimeter of solder member decal 110 to match the pattern of contact pads 412 formed on ball grid array package 112 shown in FIG. 4. According to the invention, a pattern of solder members, such as solder balls 114 may be formed on a solder member decal, such as solder member decal 110, to match a corresponding pattern of contact pads on a substrate, such as ball grid array package 112.

FIG. 4 illustrates an example of ball grid array package 112. Ball grid array package 112 is formed with an integrated circuit receiving area 410 for placement of an integrated circuit. Ball grid array package 112 is further formed with a plurality of ball grid array contact pads 412 to facilitate connection of the integrated circuit to another electronic device. Contact pads 412 may be formed flush with the surface of ball grid array package 112.

FIG. 5 is a flow chart illustrating one method of attaching solder balls 114 to a ball grid array package 112. With reference to FIGS. 1 through 5 and particularly FIG. 5, the operation of one embodiment of the invention is described. The method begins at step 510. According to the invention, at step 520 a solder member decal 110 is formed with a plurality of solder balls 114 arranged in a pattern to match a corresponding pattern of contact pads 412 on a ball grid array package 112. As discussed in greater detail below, a variety of techniques may be used to form solder balls 114 on a preformed solder connection decal 110. Such techniques may comprise, for example, forming a plurality of bosses in a substrate and allowing solder balls 114 to fall into the bosses through gravity, forming holes in a substrate and allowing the solder balls to fall into the holes through the application of negative pressure, further applying an adhesive film to the substrate having a plurality of holes, and forming a film with a pattern of adhesive regions. These exemplary techniques are discussed in greater detail below.

At step 530, solder member decal 110 is aligned with a ball grid array package 112 so that solder balls 114 are in contact with contact pads 412. Because solder member decal 110 is formed with a pattern of solder balls 114 that matches a pattern of contact pads 412 on ball grid array package 112, all of solder balls 114 may be aligned with respective contact pads 412 with one alignment step.

At step 540, solder balls 114 are transferred to contact pads 412 of ball grid array 112. According to one embodiment of the invention, solder balls 114 are transferred to contact pads 412 through a solder reflow process. The solder reflow process securely attaches solder balls 114 to contact pads 412 of ball grid array package 112. Solder reflow processes are well known and a variety of types of solder reflow processes may be used to secure solder balls 114 to contact pads 412. Solder reflow processes may be performed in a nonoxidizing atmosphere, such as nitrogen; however, an oxygen atmosphere such as air may also be appropriate.

Solder flux may be placed on either contact pads 412 or solder balls 114 before bringing the two into contact with each other and heating both the solder member decal 110 and ball grid array package 112. Alternatively, solder member decal 110 is removed from ball grid array package 112 before heating the ball grid array package 112 leaving solder balls 114 on ball grid array package 112. Various other processes may be incorporated with the invention that are operable to securely attach solder balls 114 to contact pads 412, including fluxless solder reflow processes. Substrate 111 may comprise a variety of materials. Although a variety of materials may be used, it is desirable that the substrate 111 comprise materials that can withstand the heat incurred during the transfer process and to which solder will not stick. For example, suitable materials include plastic, aluminum, silicon, quartz, or ceramics. Alternatively, materials that will burn off during a transfer process, such as paper, may be used.

The type of solder that may be used in a solder reflow process may be determined by the material used to form the ball grid array package 112. In addition, the type of material that may be used for substrate 111 of solder member decal 110 may be affected by the type of solder reflow process selected. For example, high lead solders are conventionally chosen for ceramic packages. If a ball grid array package 112 comprises a ceramic package, high lead solders may be selected. Because high lead solder may require maximum temperatures of 350° C. or more, the material used for substrate 111 may be chosen to withstand that temperature, or alternatively selected so that it will burn off during the solder reflow process.

The reflow process securely attaches solder balls 114 to contact pads 412. At step 550, substrate 111 is peeled from the ball grid array package 112 leaving an attachment-ready ball grid array package 116. Alternatively, the material of substrate 111 may be chosen to burn off during the reflow process. Thus, the invention provides a method that facilitates the attachment of solder balls to a substrate, which in turn allows the connection of various electronic devices. The method illustrated in FIG. 5 ends at step 560. The method illustrated in FIG. 5 may be used to form solder members on a plurality of substrates in addition to the ball grid array package 112, such as flip-chip electronic package 260 or an interposer (not explicitly shown).

Figure 8:
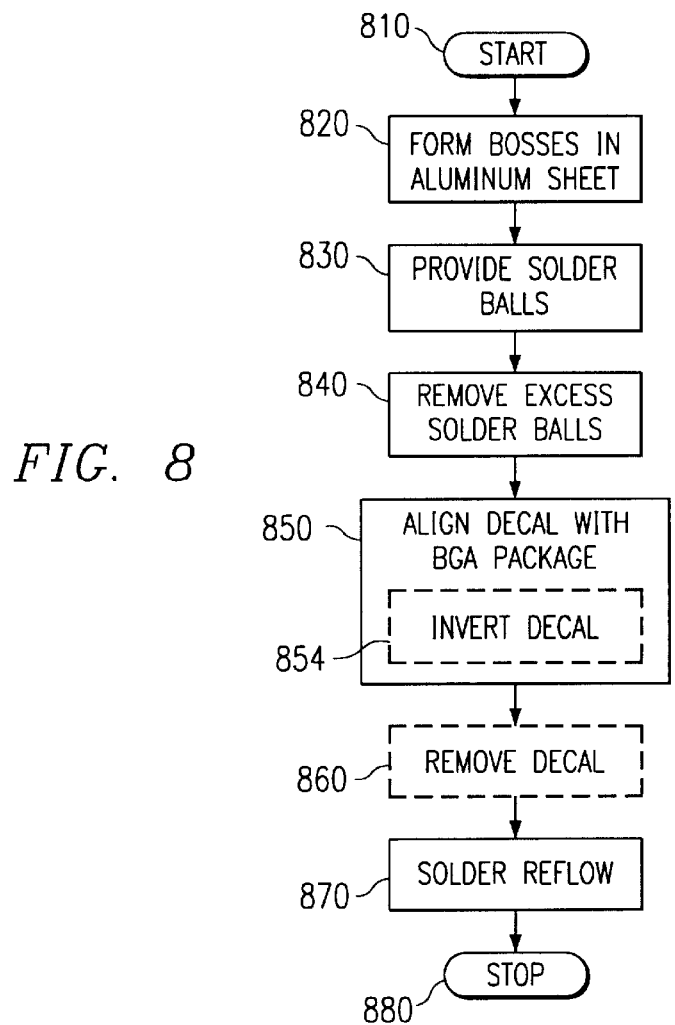
FIG. 8 is a flow chart illustrating one method of attaching solder balls to a ball grid array package utilizing the solder member decal shown in FIGS. 6 and 7.

FIGS. 6 through 8 illustrate another method for attaching solder balls 114 to a ball grid array package 112 according to the inventions. As discussed in conjunction with FIGS. 1 through 5, solder balls 114 may be replaced with solder members having a variety of configurations. FIGS. 6 and 7 are side views of solder member decal 610 and ball grid array package 112. FIG. 8 is a flow chart illustrating steps associated with the attachment of solder balls 114 to ball grid array package 112 through the use of solder member decal 610. Solder member decal 610 comprises a substrate 611 formed with a plurality of indentations or bosses 612. In one embodiment, solder member decal 610 is formed from a non-solderable material, or in other words, a material that is not wetted by solder, such as aluminum. Bosses 612 may comprise a variety of configurations. For example, bosses 612 may be formed with a configuration of a frustum, as shown in FIG. 6, or other suitable configurations that are operable to retain a solder ball. Bosses 612 should be formed with a depth sufficient to retain solder balls 114. For example, in one embodiment, bosses 612 are formed with a depth of approximately eighty percent the diameter of solder balls 114. The formation of bosses 612 is illustrated at step 820 in the flow chart shown in FIG. 8.

At step 830, solder balls 114 may be placed in bosses 612 by placing a plurality of solder balls on the surface of solder member decal 610 and allowing the solder balls 114 to fall into the bosses 612 under the influence of gravity. At step 840, excess solder balls 114 may be removed from solder member decal 610 through a variety of techniques, such as tilting or vibrating the solder member decal 610.

At step 850, solder member decal 610 is aligned with ball grid array package 112. After solder balls 114 are placed within bosses 612, the ball grid array package 112 is aligned with the solder member decal 610 and solder balls 114 are brought into contact with ball grid array contact pads 412. To facilitate transfer of solder balls 114 to contact pads 412, flux may be placed on contact pads 412. Placing flux on contact pads 412 also removes any oxide that may have formed on the contact pads. Flux may also be placed on solder balls 114. Because solder balls 114 remain in bosses 612 due to the influence of gravity, the ball grid array package 112 is placed on top of the solder member decal 110 to align the two, as shown in FIG. 6. If desired, however, forces other than gravitational forces, such as electrostatic forces, may be applied to solder balls 114 to maintain solder balls 114 in bosses 612 in an upside-down configuration. After alignment of the ball grid array package 112 with the solder member decal 610, the solder balls 114 may be secured to the ball grid array contact pads 412. One example of a process for securing solder balls 114 to the ball grid array contact pads 412 is a solder reflow process, such as the solder reflow process discussed in conjunction with FIG. 5.

The step 850 of aligning solder member decal 610 with ball grid array package 112 may comprise the step 854 of inverting the solder member decal 610 after alignment to facilitate removal of substrate 611, as shown in FIG. 7. Inversion also reduces the weight that may be applied to the solder balls 114 by the ball grid array package 112, thus reducing the likelihood that solder balls 114 will become deformed. Deformed solder balls may, however, be rounded by performing a second solder reflow. At step 860, after inversion, substrate 611 may be removed, leaving solder balls 114 in contact with the ball grid array contact pads 412. The flux placed on contact pads 412 provides sufficient adhesion to help hold the solder balls 114 on contact pads 412. At step 870, solder balls 114 may then be secured to contact pads 412 through a solder reflow process. Removal of substrate 111 reduces the overall weight of the solder member decal 610 and ball grid array package 112 combination. Therefore, removal of substrate 111 may reduce the time required for the solder reflow process due to the reduced weight. The method according the embodiment of the invention shown in FIGS. 6 through 8 ends at step 880. The method illustrated in FIGS. 6 through 8 may be used to form a plurality of solder members, such as solder balls 114, on a plurality of substrates in addition to the ball grid array package 112, such as flip-chip electronic package 260 or an interposer.

In addition to the advantages previously discussed with using a solder member decal to form solder members on a substrate, the embodiment shown in FIGS. 6 through 8 also provides the additional advantage that it is a non-vacuum process. Thus, a vacuum tool is not required with this embodiment of the invention, which may further reduce the costs associated with forming solder members on a substrate to facilitate connection of electronic components. According to the above-described procedure, a plurality of preformed solder connections may be attached to a ball grid array or other similar substrate to facilitate electrical connection of electronic devices.

Figure 9:
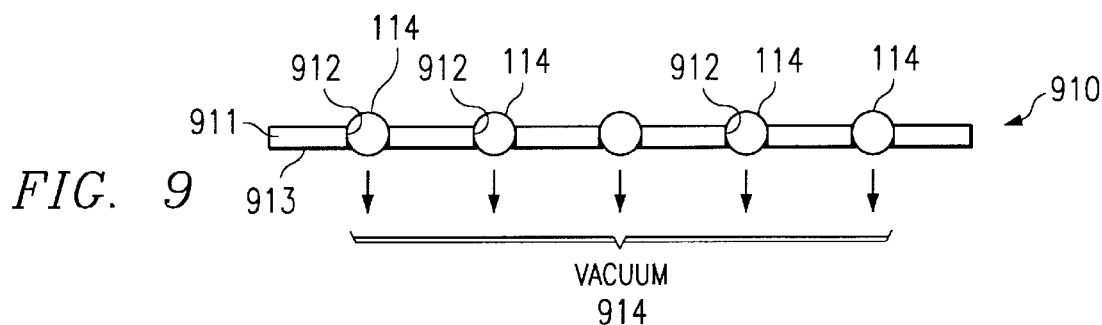
FIG. 9 is a side view of another embodiment of the solder member decal shown in FIG. 1A.
Figure 10:
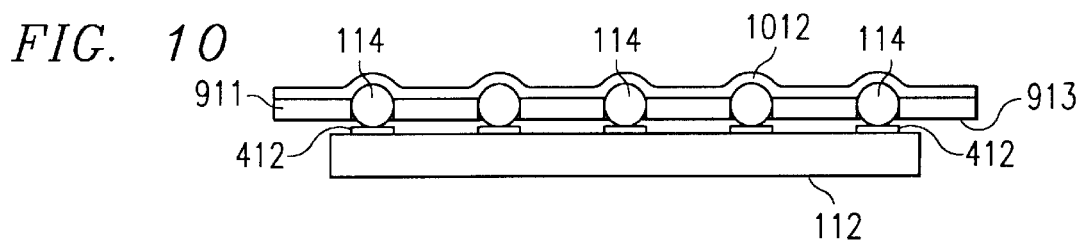
FIG. 10 is a side view of the solder member decal shown in FIG. 9 and the ball grid array package shown in FIG. 1A and illustrates the transfer of solder balls from the solder member decal to the ball grid array package.
Figure 11:
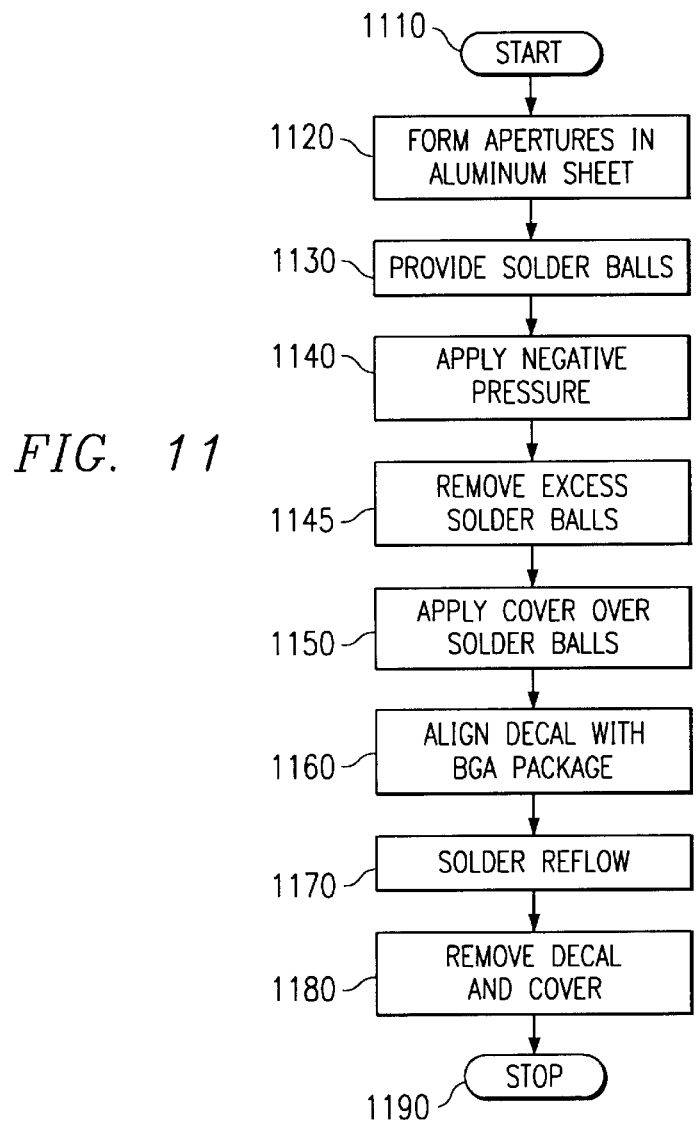
FIG. 11 is a flow chart illustrating one method of attaching solder balls to a ball grid array package utilizing the solder member decal shown in FIGS. 9 and 10.

FIGS. 9 through 11 illustrate another method for attaching solder members to a substrate according to the invention. FIGS. 9 and 10 are side view illustrations of solder member decal 910 and ball grid array package 112. FIG. 11 is a flow chart illustrating steps associated with the attachment of solder balls 114 to ball grid array package 112 through the use of solder member decal 910. Solder member decal 910 comprises a thin substrate 911 formed with a plurality of apertures 912 and a bottom surface 913. Substrate 911 is formed from a material that is not wetted by solder, such as aluminum, and is approximately 0.0030 inches thick. However, other materials and substrate thicknesses may be used. Apertures 912 are formed with a size and configuration operable to firmly hold solder balls 114. In one embodiment, the solder balls 114 extend below the bottom surface 913 sufficiently to make contact with the contact pads 412 of the ball grid array package 112. The formation of apertures 912 in substrate 911 is illustrated at step 1120 in FIG. 11. At step 1130 a plurality of solder balls 114 are placed on substrate 911. At step 1140, in order to place solder balls 114 in apertures 912, negative pressure, such as a vacuum 914, is applied to the lower surface of the substrate 911, as shown in FIG. 9, to pull solder balls 114 into apertures 912. At step 1145, excess solder balls 114 may be removed from solder member decal 910 through a variety of techniques, such as tilting or blowing them off with air. At step 1150, in order to facilitate transportation of solder member decal 910, an additional thin cover 1012 may be formed to top of solder balls 114 and substrate 911 to hold solder balls 114 in place, as shown in FIG. 10. In one embodiment, cover 1012 is formed from aluminum and is approximately 0.0010 to 0.0020 inches thick. However, other thicknesses and materials for cover 1012 may be used.

After solder balls 114 are placed in apertures 912, the solder member decal 910 is aligned with the ball grid array package 112 at step 1160 with the bottom side 913 of the solder member decal 910 facing the contact pads 412, as shown in FIG. 10. To facilitate a solder reflow process, flux may be formed on ball grid array contact pads 412. Through a solder reflow process, such as the one described above in conjunction with FIG. 5, solder balls 114 may be secured to contact pads 412. Step 1170 in FIG. 11 illustrates the solder reflow process. When solder balls 114 are heated during the solder reflow process, the solder balls 114 melt and are secured to ball grid array contact pads 412. In step 1180, the solder member decal 910 and thin cover 1012 are removed from the solder balls 114 following the solder reflow process, leaving the solder balls 114 attached to the ball grid array package 112. The method described in conjunction with FIGS. 9 through 11 produces an attachment-ready ball grid array package 116 as shown in FIG. 1C. The method of the embodiment of the invention illustrated in FIGS. 9 through 11 ends at step 1190. The method illustrated in FIGS. 9 through 11 may be used to form a plurality of solder members, such as solder balls 114, on a plurality of substrates in addition to the ball grid array package 112, such as flip-chip electronic package 260 or an interposer. According to the above-described procedure, a plurality of solder members, such as solder balls 114, may be attached to a ball grid array or other similar substrate to facilitate electrical connection of electronic devices. In addition to the advantages of solder member decals previously discussed, the embodiment discussed in conjunction with FIGS. 9 through 11 is particularly advantageous because of its ease of use and the low operating cost associated with the use of materials such as aluminum for the decal substrate 911.

Figure 12:
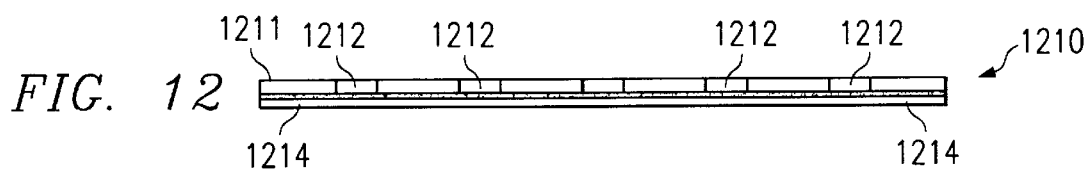
FIG. 12 is a side view of another embodiment of the solder member decal shown in FIG. 1A.
Figure 13:
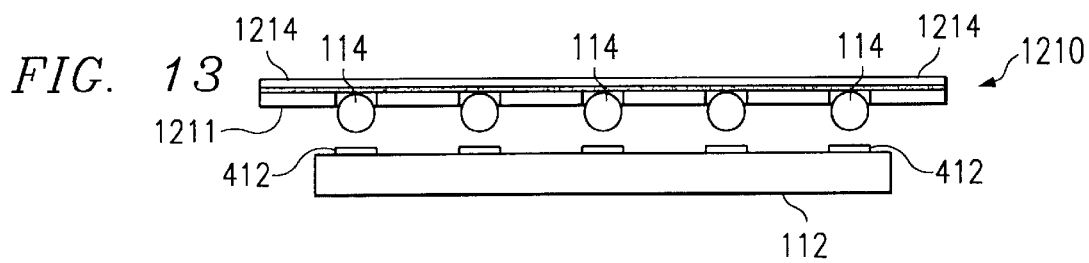
FIG. 13 is a side view of the solder member decal shown in FIG. 12 and the ball grid array package shown in FIG. 1A and further illustrates the transfer of solder balls from the solder member decal to the ball grid array package.

FIGS. 12 through 14 illustrate another method for attaching solder members, such as solder balls 114, to a substrate according to the invention. FIGS. 12 and 13 are side views of solder member decal 1210 and ball grid array package 112. FIG. 14 is a flow chart illustrating steps associated with the attachment of solder members, such as solder balls 114, to a substrate, such as a ball grid array package 112, through the use of a solder member decal 1210. Solder member decal 1210 is substantially similar to solder member decal 910 except that solder member decal 1210 is formed with an adhesive film 1214 attached to the bottom surface of substrate 1211. The adhesive film 1214 may be applied to the bottom surface of substrate 1211 in several ways. For example, the adhesive film 1214 may be applied onto a second substrate such as a plastic sheet or film (not shown). This plastic sheet may then be applied to the bottom surface of substrate 1211. Alternatively, the adhesive film 1214 may be applied directly to the bottom surface of substrate 1211. Substrate 1211 may comprise a variety of materials, including aluminum. Solder member decal 1210 is also formed with a plurality of apertures 1212. The formation of apertures 1212 and the provision of adhesive film 1214 is illustrated in FIG. 14 at steps 1420 and 1430, respectively. At step 1440, solder balls 114 are placed within apertures 1212 in the same manner as that discussed in conjunction with FIGS. 6 through 8. The adhesive film 1214 helps secure the solder balls 114 within apertures 1212. Once solder balls 114 are placed within apertures 1212, the solder member decal 1210 may be inverted and aligned at step 1445 with ball grid array package 112 as shown in FIG. 13. Excess solder balls 114 may then be removed as discussed above in conjunction with FIGS. 6 through 8. The adhesive film 1214 possesses sufficient adhesive properties such that solder balls 114 will adhere to the adhesive film 1214 when solder member decal 1210 is inverted. The adhesive film 1214 should not, however, leave any residue on the solder balls 114. At step 1450, the combination of the solder member decal 1210 and the ball grid array package 112 may be heated to transfer the solder balls 114 to the ball grid array contact pads 412 through a solder reflow process. During the reflow process, the adhesive film is burned off. After transfer of the solder balls 114, the substrate 1211 may be peeled off of attachment-ready ball grid array package 116. The method of the embodiment of the invention illustrated in FIGS. 12 through 14 ends at step 1460.

Adhesive film 1214 may comprise an ultraviolet sensitive tape such as that described in U.S. Pat. No. 5,356,751, entitled Method and Product for Particle Mounting, issued to Cairncross et al. on Oct. 18, 1994, which loses its adhesive properties when exposed to ultraviolet light. U.S. Pat. No. 5,356,751 is incorporated herein by reference for all purposes. If ultraviolet sensitive tape is used, the adhesive film 1214 may be exposed through the top of adhesive film 1214 after alignment of the solder member decal 1210 and the ball grid array package 112. Therefore, the substrate 1211 and the adhesive film 1214 may be removed from the ball grid array package 112 before the reflow process, leaving the solder balls 114 on the ball grid array package 112. Removal of the substrate 1211 and the adhesive film 1214 before the reflow process may reduce the time required by the solder reflow process. Thus, according to the above-described procedure, a plurality of solder members, such as solder balls 114 may be attached to a ball grid array or other substrate to facilitate electrical connection of electronic devices.

FIGS. 15 through 17 illustrate another method for attaching solder members to a substrate 112. FIGS. 15 and 16 are side views of solder member decal 1510 and ball grid array package 112. FIG. 17 is a flow chart illustrating steps associated with the attachment of solder members, such as solder balls 114, to a substrate, such as ball grid array package 112, through the use of solder member decal 1510. Solder member decal 1510 comprises an adhesive film 1512. Adhesive film 1512 is a light sensitive adhesive film that has a specially formulated adhesive surface 1515 that loses much of its adhesive properties when exposed to ultraviolet light. Adhesive film 1512 also comprises a second surface 1513. Adhesive film 1512 may comprise an adhesive film such as that described in U.S. Pat. No. 5,356,751, entitled Method and Product for Particle Mounting, issued to Cairncross et al. on Oct. 18, 1994. Adhesive films suitable for use with the invention are also available from manufacturers such as Ultron and Lintec.

As shown in FIGS. 15 and 17, at step 1720 a photomask 1514 is placed over adhesive film 1512. Photomask 1514 is fabricated with a plurality of regions or dots 1520 in a configuration that matches the configuration of contact pads 412 on the ball grid array package 112. At step 1730, areas of the adhesive film 1512 that are not covered by the dots 1520 of photomask 1514 are exposed to ultraviolet light 1516. Areas of the adhesive film 1512 that are covered by the dots 1520 of photomask 1514 are not exposed to the ultraviolet light 1516. Therefore, areas on the adhesive film 1512 corresponding to areas on the photomask 1514 with dots 1520 possess their full adhesive properties while the remainder of the adhesive film 1512 loses much of its adhesiveness. At step 1740 the photomask 1514 is removed. After removal of the photomask 1514 at step 1750, the adhesive film 1512 may be flooded with solder balls 114. The solder balls 114 will adhere only to the areas of the adhesive film 1512 corresponding to areas on the photomask 1514 with dots 1520. Any excess solder balls 114 may be blown off adhesive film 1512 with air. Once the plurality of solder balls 114 are formed on adhesive film 1512, they may be transferred to a ball grid array package 112.

After formation of solder balls 114 on adhesive film 1512, solder member decal 1510 is inverted, as shown in FIG. 16, and aligned on top of ball grid array package 112 such that solder balls 114 are in contact with ball grid array package contact pads 412. This step is illustrated at step 1760 in FIG. 17. Before applying a solder reflow process, at step 1770 the adhesive film 1512 may be removed by exposing the adhesive film 1512 to ultraviolet light 1616 through the second surface 1513. The ultraviolet light 1616 acts through the second surface 1513 to cause the areas on the adhesive surface 1515 previously shielded by the photomask to lose their adhesive properties. Application of ultraviolet light 1516 to second surface 1513 after alignment of the solder member decal 1510 and the ball grid array package 112 therefore releases solder balls 114 from the adhesive film 1512 and allows the adhesive film 1512 to be removed. After removing the adhesive film 1512, the solder balls 114 may be secured to the ball grid array package 112 at step 1780 through, for example, a solder reflow process such as the one described above. The method of the embodiment illustrated in FIGS. 15 through 17 ends at step 1790.

The invention therefore provides a method for attaching solder members to a substrate that facilitates precise alignment of the solder members with desired locations on the substrate. Because only the decal requires alignment, in contrast to, for example, aligning multiple solder members with desired locations on the ball grid array package, precise alignment of all solder members with desired locations on the ball grid array package may be made through one alignment process. Missing balls are often a problem in conventional ball grid array production lines. The invention may enhance the production efficiency and yield of non-missing balls by screening out defective decals before shipment to a vendor. This screening process contrasts with conventional screening that may take place after attachment of solder balls to the ball grid array package.

The invention also allows for the formation at a central site of solder member decals that may be shipped to remote locations for transferring the solder balls on the ball grid array package. Therefore, much of the equipment conventionally used to place solder on a ball grid array can be eliminated, which may reduce the cost of forming solder balls on ball grid arrays. Any equipment required to produce that solder member decal may reside at a centralized location. Formation of a solder member decals also facilitates delegation to third parties of a portion of the solder member attachment process, which may further reduce costs.

Because solder member decals may be formed without solder paste, the use of solder member decals does not expose the ball grid array package to the harshness of such a chemical process. The use of preformed solder members also eliminates the expense associated with using environmentally unfriendly chemicals. The use of solder members such as solder balls rather than solder paste also provides a more uniform distribution of solder and allows the use of various types of solder alloys.

Although the invention has been particularly shown and described by the foregoing detailed description, it will be understood by those skilled in the art that various other changes in form and detail may be made without departing from the spirit and scope of the invention.

What is claimed is:

1. A method for attaching solder members to a substrate comprising the steps of:

providing a adhesive film capable of losing adhesiveness when exposed to ultraviolet light;

placing a photomask adjacent said film to expose a plurality of areas of said film and shield other areas of said film;

applying ultraviolet light to the exposed areas of the film;

then placing a plurality of solder members on the film and allowing the solder members to adhere to the shielded areas of the film;

then aligning the film with a first substrate; and then transferring the solder members on the film to the first substrate.

2. The method of claim 1 wherein the step of aligning the film with the first substrate further comprises the step of bringing the plurality of solder members into contact with a portion of the first substrate.

3. The method of claim 1 wherein the step of transferring the solder members comprises heating the solder members.

4. The method of claim 1 wherein the step of transferring the solder members comprises a solder reflow process.

5. The method of claim 1 and further comprising the step of forming the photomask to have a pattern of photomask regions corresponding to a pattern of contact pads on the first substrate.

6. The method of claim 1 wherein the adhesive film comprises a first surface and a second surface and the step of allowing the plurality of solder members to adhere to the plurality of shielded areas of the film comprises the step of allowing the plurality of solder members to adhere to the first surface and further comprising the step of applying ultraviolet light to the second surface to facilitate removal of the film from the solder members.

7. The method of claim 6 wherein the step of transferring the solder members comprises a solder reflow process and further comprising the step of removing the film before the solder reflow process.

8. The method of claim 1 wherein the step of aligning the film with said first substrate comprises aligning the film with a ball grid array.

9. The method of claim 1 wherein the step of aligning the film with said first substrate comprises aligning the film with a flip-chip electronic package.

10. The method of claim 1 wherein the step of placing a plurality of solder members on the film comprises the step of placing a plurality of solder balls on the film.

* * * * *